(12) United States Patent
Branth et al.

(10) Patent No.: US 7,565,597 B1
(45) Date of Patent: Jul. 21, 2009

(54) FAST PARITY SCAN OF MEMORY ARRAYS

(75) Inventors: Kenneth Branth, Redwood City, CA (US); Kee W. Park, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 562 days.

(21) Appl. No.: 11/315,971

(22) Filed: Dec. 21, 2005

(51) Int. Cl.
*G11C 29/00* (2006.01)

(52) U.S. Cl. .................. 714/763; 714/800; 714/804

(58) Field of Classification Search .......... 714/763, 714/800, 803, 804, 773; 711/105
See application file for complete search history.

(56) References Cited

U.S. PATENT DOCUMENTS 6,216,251 B1 * 4/2001 McGinn ............... 714/800
7,107,390 B2 * 9/2006 Teng ................... 711/105

* cited by examiner

*Primary Examiner*—Esaw T Abraham
*Assistant Examiner*—Fritz Alphonse
(74) *Attorney, Agent, or Firm*—Michael R. Hardaway; Glass & Associates

(57) ABSTRACT

A novel method for scanning bit parity in a memory array, and a circuit for implementing it, are disclosed. In a memory array that has one or more rows of memory cells, the method for checking data parity includes storing a plurality of data bits in the memory cells, scanning a row of memory cells independently of a memory read operation to ascertain the stored data bits; and determining parity for the row of memory cells by the results of the scanning. The method is accomplished by means of a dedicated parity scanning circuit.

22 Claims, 6 Drawing Sheets

FAST PARITY SCAN OF MEMORY ARRAYS

BACKGROUND OF THE INVENTION

The speed of memory devices has increased with the reduction in operating voltages and in the characteristic feature dimensions found in semiconductor devices. However, conventional memory devices are highly susceptible to soft errors.

Soft errors can be caused by, for example, the impact of cosmic rays, or other radiation. In memory devices, these soft errors can occasionally change a data bit in a stored word of data. One method long practiced for enhancing the reliability of stored data bits is a parity check. The simple parity check relies on a parity bit, a memory cell separate from those used in storing the data word. The parity bit is set to logical "1" or "0" in order to make the total count of set bits in a stored word of memory either an even number or an odd number. While being able to very quickly and inexpensively find a single-bit error in a word, simple parity cannot detect an error in two bits, or four, since the total count parity remains the same. Simple parity checking is also unable to repair a bit in error since it cannot detect which bit in a word is in wrongly set.

In error correcting code (ECC) applications, a specific set of bits are calculated for each memory location as it is written. This requires more parity cells to be associated with each memory location, but multi-bit errors can be detected and cured. However, in using ECC, the required increase in memory cells can cause an increase cost of manufacture.

One common method of parity checking is that of scanning through a memory array, during memory idle cycles, to scan for parity errors. In this method, one memory word at time is scanned. While this method ensures thorough memory scanning, it sometimes requires that other operations be held up in order to complete the scan. This can result in delays in the memory operation and a dedicated read port is sometimes needed to access one word each clock cycle.

Accordingly, there is a need for a method for scanning parity check bits that does not delay memory read/write operations that can be implemented with a minimal impact on memory chip real estate usage and that ensure a complete memory scan.

SUMMARY OF THE INVENTION

The present invention provides a method for rapid parity scanning of memory arrays. The method, and the circuit by which it is implemented, allows uninterrupted memory operation, can be implemented with a minimal impact on memory chip real estate, and ensures a complete memory scan.

A novel method for scanning bit parity in a memory array, and a circuit for implementing it, are disclosed. In a memory array that has one or more rows of memory cells, the method for checking data parity includes storing a plurality of data bits in the memory cells, scanning a row of memory cells independently of a memory read operation to ascertain the stored data bits; and determining parity for the row of memory cells by the results of the scanning. The method is accomplished by means of a dedicated parity scanning circuit.

These and other objects and advantages of the present invention will become obvious to those of ordinary skill in the art after having read the following detailed description of the preferred embodiments that are illustrated in the various drawing figures.

DETAILED DESCRIPTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description, numerous specific details are set forth in order to provide a thorough understanding of the present invention. However, it should be understood by one of ordinary skill in the art that the present invention may be practiced without these specific details. In other instances, well-known methods, procedures, components, and circuits have not been described in detail so as not to unnecessarily obscure aspects of the present invention. At times, concepts disclosed in this discussion of embodiments of the present invention will be made more readily apparent by reference to the Figures.

Figure 1:
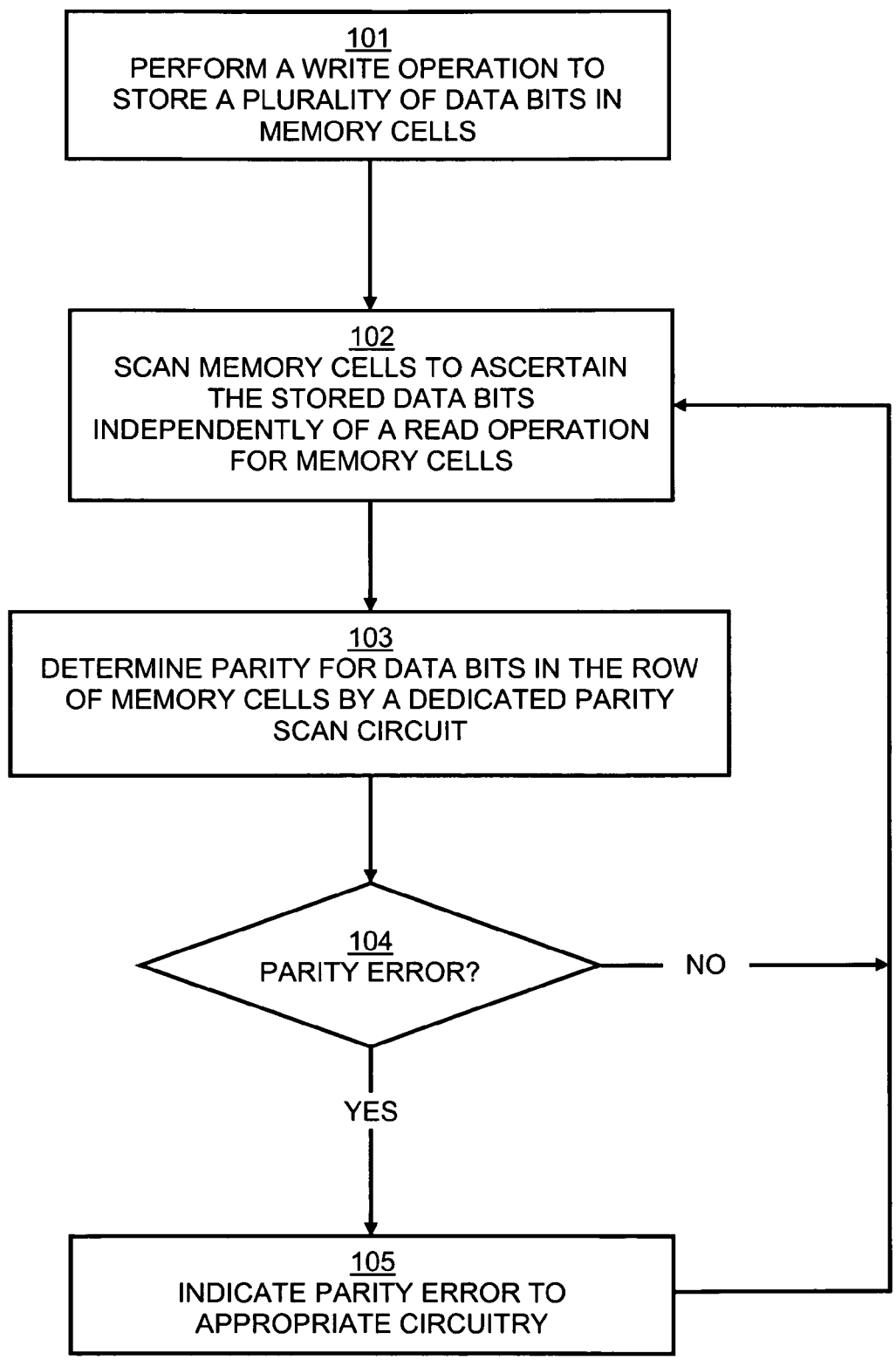
FIG. 1 illustrates a flow diagram of a rapid parity scanning method in accordance with an embodiment of the present invention.

FIG. 1 illustrates a flow diagram of a method for rapid parity scan in a memory device. The method starts with performing a memory write operation to store data 101, in the form of a plurality of data bits, in an array of memory cells. The memory array can be in an SRAM, a DRAM, or any other type of memory device. In the present embodiment, however, an SRAM device is used as an illustrative example. It is noted that parity checking or scanning is typically found in memories storing relatively high priority data. Memories storing lower priority data typically rely on data integrity checking that is accomplished externally to the memory device.

Referring still to FIG. 1, the memory cells are scanned 102 to ascertain the stored data bits in the memory cells. Scanning, in this embodiment of the present invention, is accomplished by means of a dedicated scanning circuit which allows the scanning to occur without interrupting a memory read operation and without requiring the initiation of a read operation.

It is noted here that memory devices are typically arrayed in logical rows and logical columns. It is also noted that the physical layout of a memory device is driven by many factors and cells are not necessarily arrayed physically in rows and columns. Memory data are commonly stored in logical rows but adjacent cells in logical rows may not be physically proximate. However, scanning, in one embodiment, is accomplished on a logical row-by-row basis.

It is also noted that a logical row of memory cells can be referred to as a word row and a logical column can be referred to as a bit column. These designations derive from the word and bit relationship in memory operations. For example, in one common type of memory, a bit line or a pair of bit lines are set to a high or low data state, then raising a word line to a high state causes the memory cell to take on the bit line state. This is one form of memory write operation. In other types of memory, operations can be accomplished by different means. In this discussion of embodiments of the present invention, the term word line refers to an electronic line that actives a portion of a memory cell, while a word row is a logical array of memory cells whose stored bits are related to each other in a data word. Word row and memory row are used herein more or less interchangeably.

Still referring to FIG. 1, after a row of memory cells is scanned, parity for the row, or a byte in the row, is determined 103. In one embodiment, the determination is made by binary addition, or summation, of the bits in the memory row.

Parity, it is noted, provides a means of insuring that, when the memory location is read for the data it holds, it is the same data that was written. A parity bit, in this embodiment of the present invention, is a single bit that is set to make a total number of logical "1" bits in a data grouping plus the parity bit equal to either an odd number or an even number, depending on the specific parity required. For example, if the data word is "00010110" which contains three bits set to "1," the parity bit is set to "1" to make the total of "1" bits equal to four, for even parity. If the data word is "00110101" which contains four bits set to "1", the parity bit is set to "0" to keep the total count of "1" bits at four.

It is noted here that single parity bit checking requires only one additional memory cell for each byte or word. However, a single parity bit can only detect a single bit error. It cannot detect the location of the bit in error, nor can it detect a two-bit error, or any other even-numbered error.

In one embodiment of the present invention, error correcting code (ECC) parity is determined. There are multiple types of error correcting code parity checks. However, each requires more memory cells than single bit parity.

One example of error correcting code parity requires four extra data bits for each eight-bit data word. Because of the positional relationship of the four additional bits, this example of error correcting code can detect multiple errors and their locations in a data byte.

Referring still to FIG. 1, if a parity error is determined, 104, the parity error is indicated 105. Indication can be accomplished by making the result of the bit summation above available to appropriate circuitry. In one embodiment, indicating a parity error is accomplished by initiation of error correcting code. If no parity error is detected, scanning can continue.

In one embodiment of the present invention, it is noted, scanning is accomplished in an array of word rows simultaneously. In the present embodiment, determination of a parity error is made for each row.

In another embodiment, parity values and their associated data values are read and, if a parity error is indicated, a parity error flag bit is set. Then, at any time, a dedicated parity scan circuit can quickly scan the entire memory's parity error flags for error indications. In yet another embodiment, specific portions of a memory array can be scanned at any time. It is noted that these parity scans can be accomplished at any time, including during memory read cycles.

It is noted here, again, that parity bits can be included in the data written to a word row of memory. Parity memory for a personal computer, for example, can have nine memory cells designated for each eight-bit word of data to be stored. This leaves one bit to be set to a parity value, either "1" or "0". When a word row is scanned, the data bits and the parity bit or bits are scanned together.

It is again noted, in one embodiment of the present invention, that each memory word row can be read by means of the dedicated scanning circuit simultaneously. Because the scanning is accomplished by the dedicated circuit, the scanning does not have to stop during a memory read cycle nor initiate a read operation to ascertain parity. Each memory parity scan can then occur rapidly and can scan an entire memory or portion of it without interruption.

In yet another embodiment of the present invention, a sequential parity scan is accomplished through a memory array independently of other memory operations. If a write operation should occur during the parity scan in this embodiment, the parity scan can wait until the write operation is complete then rescan the written memory word and continue on through the array. A memory scan can be accomplished over multiple clock cycles and over multiple memory operations. Again, a parity scan in this and other embodiments is enabled to be accomplished independently.

Figure 2:
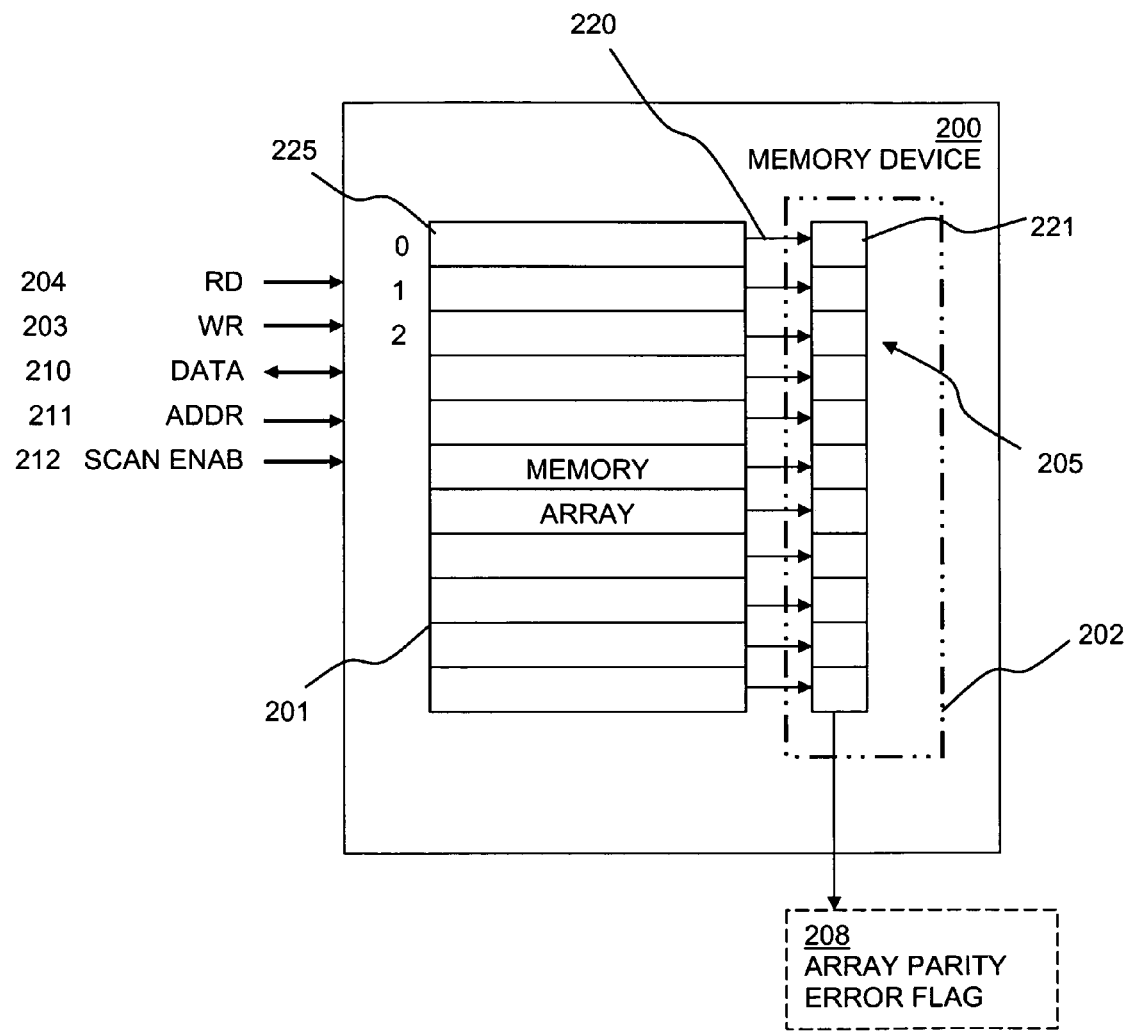
FIG. 2 illustrates data flow, in a memory device, of a rapid parity scanning method in accordance with an embodiment of the present invention.

FIG. 2 illustrates data flow of an embodiment of a memory device enabled for rapid parity scanning. In FIG. 2, a memory device 200 is shown which contains an array of memory locations 201. The array of memory locations, or cells, is a logical array of word rows of memory. Memory device 200 can be any type of electronic memory, such as DRAM, SRAM, or various types of ROM, for example. However, in the present embodiment, memory device 200 is SRAM. It is noted that the specific drawing arrangement of objects in FIG. 2 is strictly for illustrative purposes and is not intended to limit any physical relationships in implementation of embodiments of the present invention.

In one embodiment of the present invention, memory cell array 201 is arranged logically in bit-wise columns and word-wise rows. As noted earlier, this derives from the operation of typical memories in setting an individual bit by the activation of its associated word line and bit line. Each memory cell is unique to a specific pairing of a word line and a bit line. A memory word, it is noted, is a group of bits whose grouping and length is dependent on the system in which the memory is operating. A word can consist of a single eight-bit byte or a sixty-four bit word consisting of eight bytes or any other number appropriate to the operation. Word length is typically, but not exclusively, in multiples of eight. The word "byte", it is noted, typically refers to a grouping of eight bits and is used as such in this description. However, the term byte can refer to other numbers of bits, though it is used to designate an eight-bit grouping in this discussion. The terms "memory word", "word stored in memory", "data word", and the like are used in this discussion more or less interchangeably.

It is noted here also that a logical arrangement of word rows and bit columns is solely a logical concept. The physical relationship of memory cells is determined by considerations of chip design and construction. Describing cells as being arranged in rows and columns is meant only to describe the electrical and logical relationships and not, necessarily, physical construction.

Memory device 200 has a dedicated parity scan circuit 202 that includes an array 205 of dedicated parity scan elements such as exemplary parity scan element 221. As indicated in reference to FIG. 1, above, a parity scan element 221 can be a summing circuit or another circuit enabled to determine the parity of a scanned grouping of stored data bits. In the example in FIG. 2, parity scan element 221 is associated with the "0" memory word row 225 and is enabled to accept the output of row parity scan line 220.

It is noted here that hexadecimal notation is the common shorthand used to designate the sixteen possible combinations of each group of four bits in a data word. For example, if a byte is set to 0101 1101, the hexadecimal notation for that setting would be 5Dh.

In one embodiment of the present invention, a storage location in parity scan element 221 stores a parity check result of its associated word row 225. When the word row parity scan circuit checks parity for a word row, it totals the number of logical "1" bits, including the parity check bits. A parity check result is then the least significant binary digit of the sum.

For example, consider that there are four bytes stored in a word row (e.g., method step 101, above) and those four bytes are set to "0101 1111 0111 0011 0100 1110 0010 0001" which can be written hexadecimally as 5F 33 4E 21 h. With a single parity bit for each data byte set to even parity, the full word row is set to "0101 1111 0 0111 0011 1 0100 1110 0 0010 0001 0." The total number of "1" bits, including the parity bits, is eighteen, an even number. In binary notation, eighteen is "10010". Like all even binary numbers, its least significant digit is "0". Therefore, when the number of word row bits set to "1" is scanned (e.g., method step 102, above) and summed for each word row and the respective sum's least significant digit is stored in the associated parity value storage location in parity scan element 221, all of the bits in dedicated parity scan circuit 202 are set to "0." A full parity scan is then enabled to be accomplished by a simple check of the parity scan element array 205 in dedicated parity scan circuit 202 to see if any bit is set to "1" (e.g., method step 103, above). If any bit is set to "1", an error indication is set 208 (e.g., method step 105, above). It is also noted that if odd parity is the paradigm, then the error indication is set on finding a bit set to "0".

In an embodiment of the present invention implementing multiple bit parity, such as error correcting code, parity scan element array 205 can include an array of multiple bit locations. In one embodiment, an error correcting code format is used which requires four parity bits for each data byte stored. It is noted that there is more than one type of error correcting code. In this embodiment, the array of parity bit storage locations in parity scan element array 205 is an array of four-bit locations, each of which contains a parity code associated with a byte of stored data.

In one embodiment, an array of parity bit storage locations, each in the array of parity scan elements 205, is enabled to be scanned at any time data are stored in the array of memory locations 201. Scanning takes place without affecting the memory's read operations or other normal operations by virtue of being accomplished in dedicated circuitry. In this embodiment, each memory cell is augmented with a memory cell scanning transistor that allows the parity scan circuit to ascertain the memory cell state without changing the state.

Referring still to FIG. 2, a normal write operation includes presenting data at data bus 210, sending it to a location address signaled on address bus 211, and enabling the write via write enable 203 (e.g., method step 101 above). A read operation includes requesting a read from an address presented on address bus 211, enabling the read with read enable 204, and sending the data out on data bus 210. Again it is noted that a parity scan is conducted independently of a read operation in this embodiment. A parity scan can be initiated via scan enable 212.

It is noted here that scan enable 212 is shown solely to illustrate a logical concept of embodiments of the present invention. Scanning of data within rows of memory cells may be initiated by logic within dedicated parity scanning element, within a memory controller, or resident within some other logic source. Embodiments of the present invention are directed to memory parity scan conducted, independently of other memory operations, by means of dedicated parity scan circuitry. The initiation of memory scanning can be from any source.

Figure 3A:
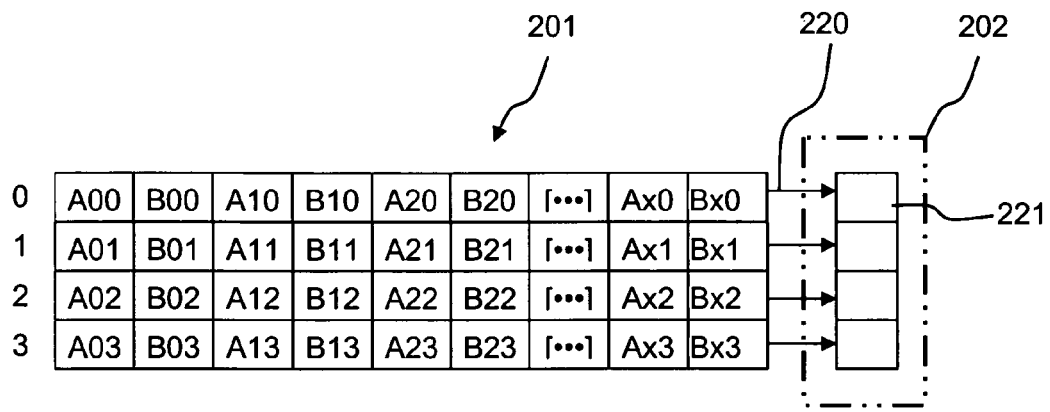
FIG. 3A illustrates a data flow of rapid parity scanning of rows of memory cells in accordance with an embodiment of the present invention.

Referring now to FIG. 3A, more detail is shown of memory array 201. Memory array 201 is shown as a row and column array of memory locations. In this embodiment, the memory locations of memory array 201 are labeled as most significant and least significant characters in an octet of bit cells. For example, word row "0" in memory array 201 contains character arrays A0 and B0 through Ax and Bx. It is again noted that hexadecimal notation is used in this description in order to clearly illustrate concepts presented in embodiments of the present invention.

In word row 0 of memory array 201, notations A00, B00 etc. through Ax0 and Bx0 each represents a four bit array of bit cells in word row 0. It is noted that the "A" designation indicates the most significant hexadecimal digit and the "B" designation indicates the least significant hexadecimal digit of the data byte. For example, B00 here denotes bit positions 0 through 3 in byte 0 of word row 0 and A00 represents bit positions 4 through 7 in byte 0 of byte 0 in word row 0. Ax3 represents bit positions 4 through 7 in byte x of word row 3 and Bx3 represents bit positions 0 through 3 in byte x of word row 3.

In an example of operation in one embodiment of the present invention, two hex digits of a byte, 5Dh, are stored in memory locations Ax0 and Bx0, respectively. 5Dh in binary notation is "0101 1101." Because there are an odd number of "1" bits, an even parity bit value would be "1" to bring the parity to an even total. The parity value of 1 is stored in a parity value storage location in row parity scan element 221, associated with word row 0. In the embodiment illustrated in FIG. 3, a parity check bit value is computed for each eight-bit byte in word row 0.

It is noted here that a parity check bit can be stored in a number of ways. In one embodiment, one parity bit is computed for an entire row and is stored in a location within dedicated parity scan circuit 202. In another embodiment, a parity check bit is computed for each eight-bit byte in a memory row and is stored in a logically adjacent memory cell. In this embodiment, each byte of data and its associated parity check bit can occupy a word row comprised of nine-bit bytes (e.g., eight data bits and one parity bit).

In another embodiment, a single parity bit is computed for an entire word row of stored data. In this embodiment, summing the individual bits of stored data and adding the parity bit produce an even or an odd number. If even parity is sought, an odd number (e.g. a least significant digit of "1") indicates a parity error. If odd parity is sought, an even number (e.g. a least significant digit of "0") indicates a parity error.

This embodiment, it is noted, provides no indication which bit is in error but does indicate which word row contains the error. If an error is detected, a request for renewed data can be sent to the data source. It is also noted that this simple form of parity checking, of the various embodiments discussed herein, requires the least impact on semiconductor space.

In the present embodiment, dedicated parity scan circuit 202 is enabled to simultaneously scan the word rows of memory array 201 via row parity scan line 220 (e.g., method step 102, above). This scanning can be accomplished without interrupting the memory read and write operations. It is noted, however, that in one embodiment of the present invention, a write operation invalidates a concurrent word row scan.

Figure 3B:
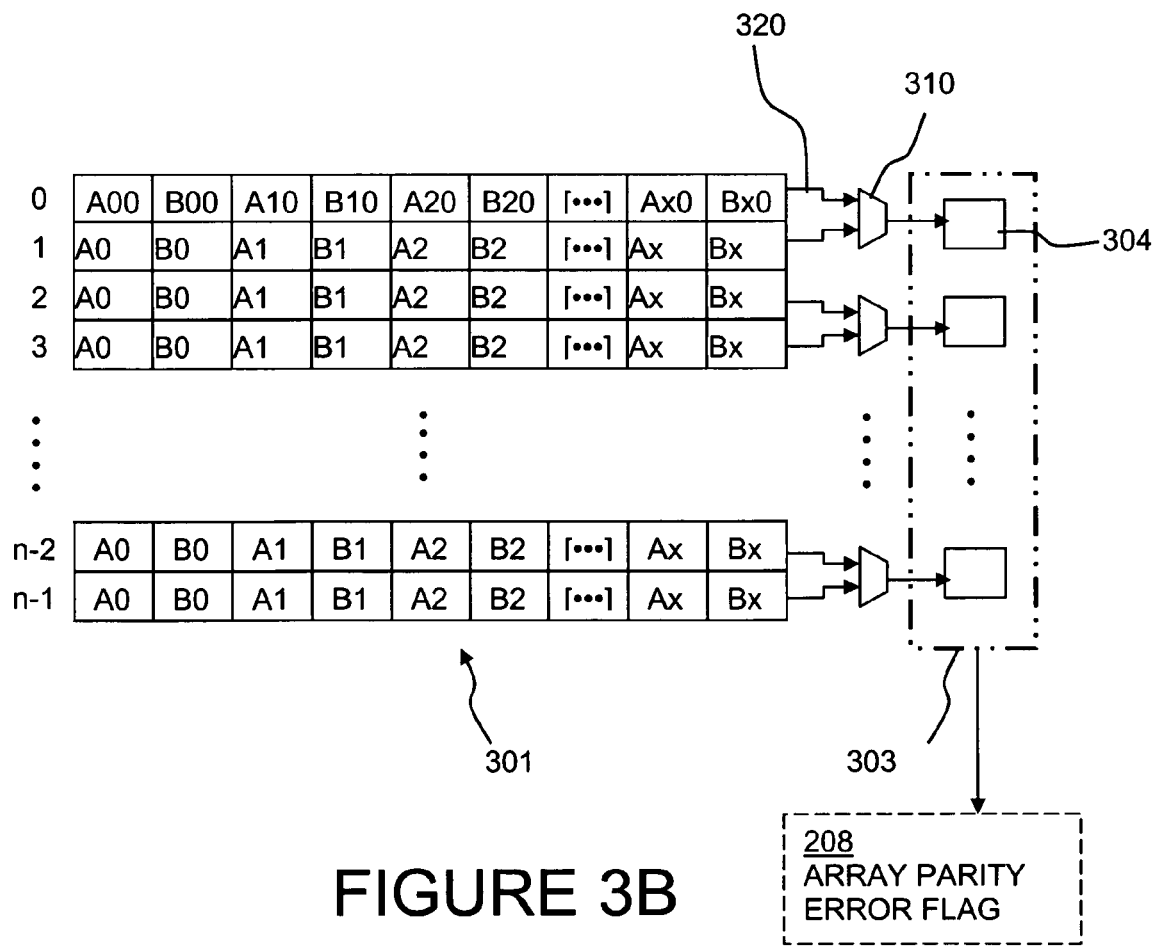
FIG. 3B illustrates a data flow of rapid parity scanning of alternating rows of memory cells in accordance with an embodiment of the present invention.

Referring now to FIG. 3B, memory 301 is a row and column array of memory locations. Dedicated parity scan circuit 303, however, in this embodiment of the present invention, contains an array of row parity scanning elements, such as exemplary parity scan element 304, that can read and store a parity value for either of two word rows of stored data. In this embodiment, parity scan element 304 is connected to word rows 0 and 1 by multiplexer (MUX) 310. MUX 310 can be implemented in a number of way, however, it is implemented here as a switch controlled by logic associated with parity scanning element 304.

When a parity scan is taken in this embodiment, the row parity scan elements are enabled to alternate between two word rows, scanning from the row parity scan lines 320 associated with the row being scanned. For example, row parity scan element 304 can be the parity scanning element for word row 0 and for word row 1. By alternating word rows, one row parity scanning element can accommodate two word rows, thus reducing the required semiconductor fabrication space. In another embodiment, each row parity scan element can accommodate three or more word rows. In this embodiment, MUX 310 can be a switch with three inputs.

In normal operation, memory arrays are written to (as discussed at step 101 in reference to FIG. 1, above) and read from, independently of the operation of dedicated scanning circuits 202 and 303. As discussed in reference to FIG. 2, a write operation involves address bus 211, data bus 210, and write enable line 203. A read operation involves address bus 211, data bus 210, and read enable line 204. Neither operation requires the use of dedicated parity scanning circuits 202 or 303.

Figure 4:
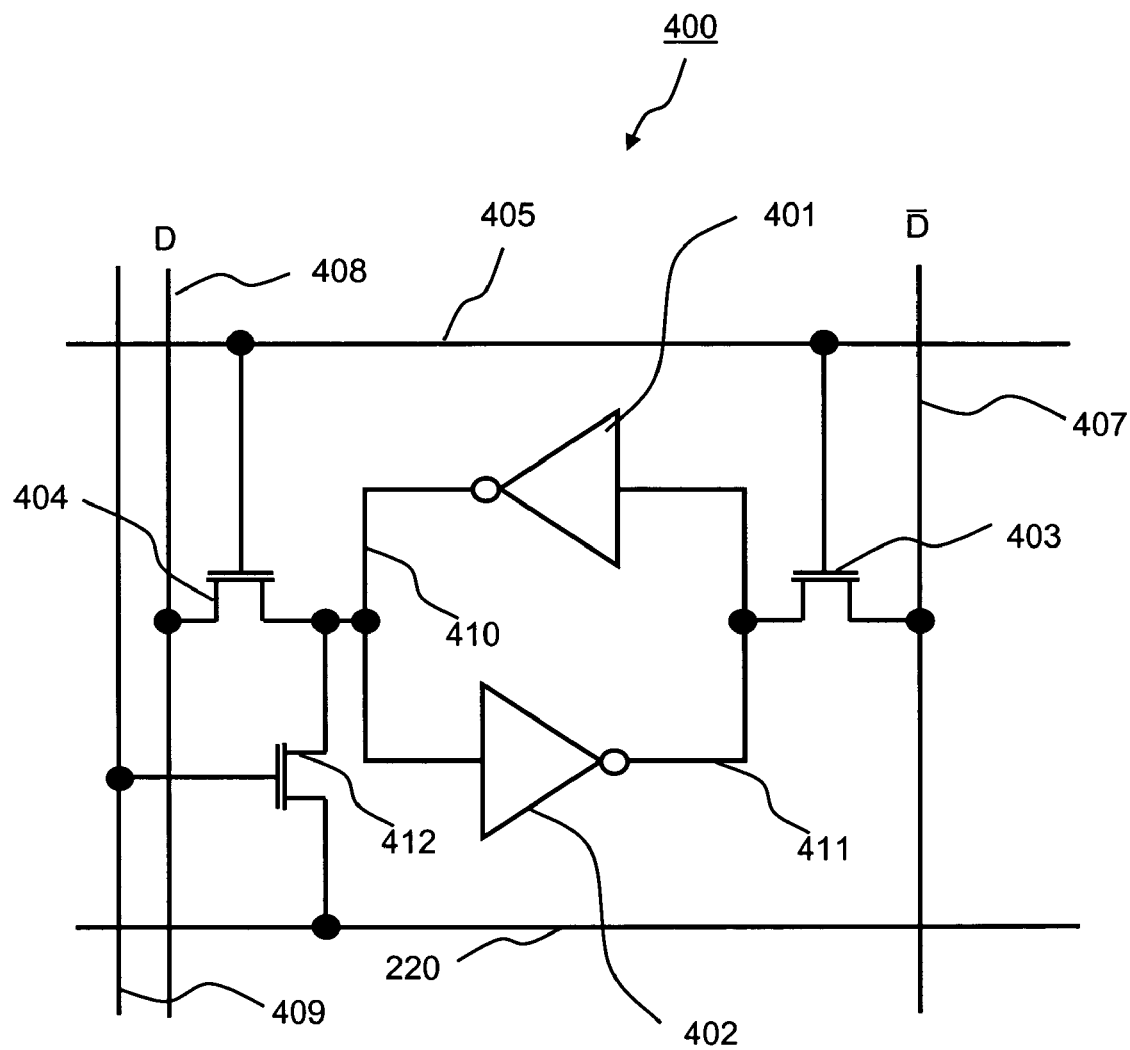
FIG. 4 illustrates an memory cell configured with a dedicated parity scan circuit in accordance with an embodiment of the present invention.

FIG. 4 illustrates scan enabled memory cell 400 that allows for parity checking independently of memory cell read and write operations. In the present embodiment, memory cell 400 is an SRAM memory cell. In addition to the core memory cell, memory cell 400 has an additional transistor, 412, to enable parity checking in accordance with embodiments of the present invention.

The core of memory cell 400 is a pair of inverting buffers 401 and 402. Inverting buffers 401 and 402 are configured back to back, meaning that the output of each is connected to the input of the other to form a latching arrangement.

It is noted that, in one embodiment, inverting buffer 401 is constructed of a PMOS transistor whose source is connected to the drain of an NMOS transistor. Inverting buffer 402 is constructed of another NMOS transistor whose source is connected to the drain of a PMOS transistor, in which the drain of the first PMOS transistor and the drain of the second NMOS transistor are connected to Vdd and the sources of the first NMOS transistor and the second PMOS transistor are connected to ground. The source/drain connection of the first pair of transistors forming buffer 401 is connected to the gates of the second pair forming buffer 402, and the source/drain connection of the second pair of transistors is connected to the gates of the first pair of transistors. This forms a latching circuit with the output of buffer 401 connected to the input of buffer 402 and the output of buffer 402 connected to the input of buffer 401.

The source of an NMOS R/W enable transistor 403 is connected to the source/drain connection of the first pair of transistors (input of buffer 401 and output of buffer 402) and its drain is connected to the low bit enable line 407 of the memory bit column. The source of NMOS R/W enable transistor 404 is connected to the source/drain connection of the second pair of transistors (input of buffer 402 and output of buffer 401) and its drain is connected to the high bit-enable line 408 of the memory bit column. The gates of both RAN enable transistors 403 and 404 are connected to word line 405 of the memory word row. It is noted that the transistors that comprise inverting buffers 401 and 402, in this embodiment, are typical of SRAM design and are not shown here for purposes of clarity.

To perform a write operation in memory cell 400, the low bit enable line 407 and the high bit enable line 408 are first set to the state values to be stored. A high memory state or "on", for example, is set by charging high bit line 408 to a high state and low bit line 407 to a low state. A low memory state or "off" is set by the opposite values. The word line 405 is then set high, causing the R/W enable transistors to charge the latching circuit to the set states.

To perform a read operation, both low bit line 407 and high bit line 408 are set high and the word line 405 is then set high. This makes R/W enable NMOS transistors 403 and 404 conductive, thus setting low bit line 407 and high bit line 408 to the states of nodes 411 and 410, respectively. The bit line that changes state then indicates the memory cell data state. If low bit line 407 goes low, the memory cell state is high or "on". If the high bit line 408 goes low, the memory state is low, or "off".

When memory cell 400 is set to an "off", or low, state, the input of buffer 401, node 411, is set high. Buffer 401 is inverting, thus its output and the input of buffer 402, node 410, is set low which keeps the output of buffer 402 high. The cell is thus latched in a low state at node 410 and a high state at node 411.

When memory cell 400 is set to a high or "on" state, the input of buffer 401, node 411, is set to a high low state and node 410 is set high. The same latching effect occurs and the state is maintained.

Memory cell 400 is also configured with an additional NMOS transistor 412 in this embodiment of the present invention. The drain of NMOS transistor 412 is connected to node 410 in this embodiment. In another embodiment, the drain is connected to node 411. In either case, the source of NMOS transistor 412 is connected to row parity scan line 220 and its gate is connected to parity scan bit enable line 409.

In construction, NMOS transistor 412 is relatively small in comparison to the NMOS and PMOS transistors that form inverting buffers 410 and 402. Thus when it is actuated by a high state at parity scan bit enable line 409, it does not draw enough current to alter the state of node 410 in the cell. Row parity scan line 220 is then pulled to the same state as that of node 410. If node 410 is high, indicating a high or "on" memory cell state, then row parity scan line 220 is pulled high. If node 410 is low, indicating a low or "off" memory cell state, then row parity scan line 220 is pulled low. Thus the state of the memory cell is read by row parity scan line 220 (e.g., method step 102, above).

By only checking one side of the latched buffers, the parity scan does not change the cell state. Because the actuation of NMOS 412 does not affect the state of memory cell 400, ascertaining the cell state can take place at any time. Scanning, as discussed in step 102 above, takes place independently of read operations. More particularly, scanning a data bit or parity bit is performed without activating either low bit enable 407, high bit enable 408, or word line 405.

By enabling ascertainment of the state of memory cell 400, NMOS 412 provides a means by which parity can be scanned without regard to other operations. The dedicated parity scan circuit does not need to wait for an idle cycle in the memory operation to scan.

In the present embodiment, data bits that are scanned in a memory row can include parity check bits. As discussed elsewhere herein, a single parity bit can operate to verify parity for an entire word row or only a data byte within a row or, in an implementation using error correcting code, a group of parity bits can be required for each byte of data. Each bit, it is noted, is stored in a memory cell in memory row 225. Memory row 225 is comprised of memory cells enabled for rapid parity scan such as memory cell 400.

Figure 5:
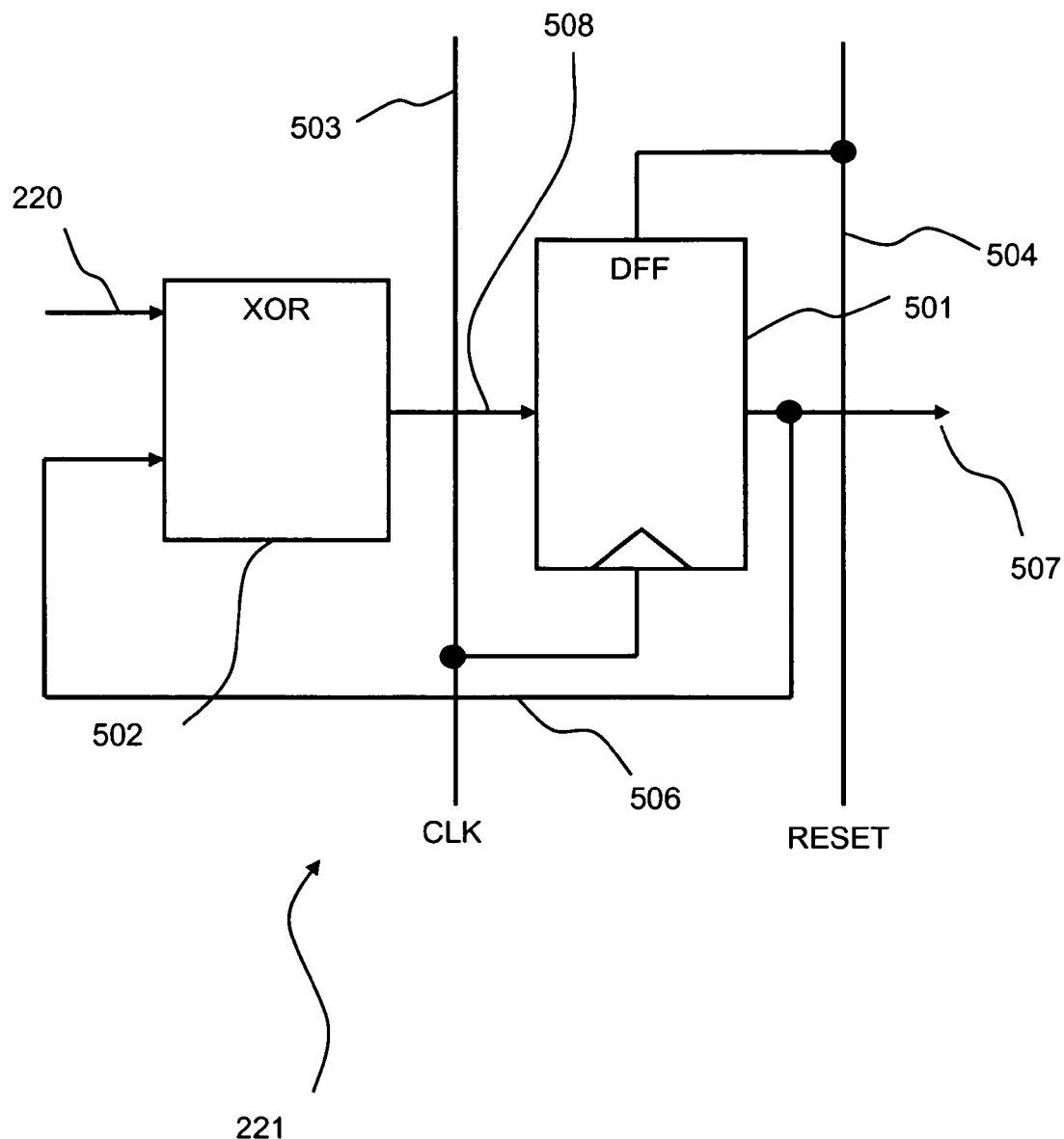
FIG. 5 illustrates an implementation of a rapid parity scan element in accordance with an embodiment of the present invention.

FIG. 5 illustrates an embodiment of dedicated parity scan element 221 in which a "Set/Reset" memory cell 501 and an exclusive or gate 502 are used to implement rapid parity scanning. In one embodiment, memory cell 501 is a data flip/flop (DFF) cell. It is noted that a DFF cell stores the input value of a signal when triggered by the clock input. Parity scan element 221 is a component of the dedicated scan circuitry 202 discussed above in reference to FIGS. 2 and 3. It is noted that another embodiment of the present invention, memory cell 501 is implemented as another type of cell.

DFF cell 501 is connected to "CLK" line 503 and "Reset" line 504. It is noted here that DFF cell 501 is also connected to supply voltage and ground connections, as well as other normal connections of memory cell operation, that are not shown in FIG. 5 for the purpose of clarity.

DFF cell 501 is also connected to the output 508 of exclusive OR gate 502 and to parity scan result output 507. Exclusive OR gate 502 has two inputs: row bit parity scan line 220 (discussed in reference to FIGS. 2, 3, and 4, above) and feedback 506 from parity scan result output 507. The output 508 of exclusive OR gate 502 is, as stated above, connected to the parity check input of DFF cell 501.

In this embodiment, when a scan cycle is initiated, DFF 501 is in a "reset", or cleared, state by the action of Reset line 504. In each parity scan cycle, the CLK line 503 is toggled for each bit in the word row to store each immediate result, the state of row parity scan line 220, in DFF cell 501. When all the stored memory bits in the associated row have been scanned, the resultant parity scan status is observable on parity scan result output 507.

The net effect of the toggling on input from the parity scan is that the lowest significant digit of the sum of all bit values in the word line is presented at the parity scan result output 507. Parity scan result output 507 is, effectively, a parity error flag bit. As discussed earlier, in an embodiment using even parity, the row parity is going to flag an error if the parity scan result 507 is "1". If the embodiment is using odd parity, an error is flagged on a "0".

Referring still to FIG. 5, exclusive OR gate 502, by the action of feedback from parity scan result output 507, delivers a high indication to DFF 501 if either of its inputs is high, but not if both are high. If parity scan result 507 is "1", or high, the next high bit scan input from the associated word row cannot be read until DFF 501 is reset. This ensures that each scanned bit is distinct from others in the word row.

Step 101, discussed in reference to FIG. 1 above, is implemented in normal write operations using data bus 210, address bus 211, and write enable 203. Step 102, scanning data and parity bit state, is implemented in memory 225 by ascertaining the state of each memory cell 400 in row 225. This is accomplished by activating bit scan enable line 409 to make scanning transistor 412 conductive and set row parity scan line 220 to the memory cell state, which is read by parity scan element 221. Step 103, determining parity, is implemented by parity scanning element 221, as discussed above, and the result is made available on scan result output 507. When scan result output 507 shows a parity error, parity error flag 208 so indicates to other circuitry.

Figure 6:
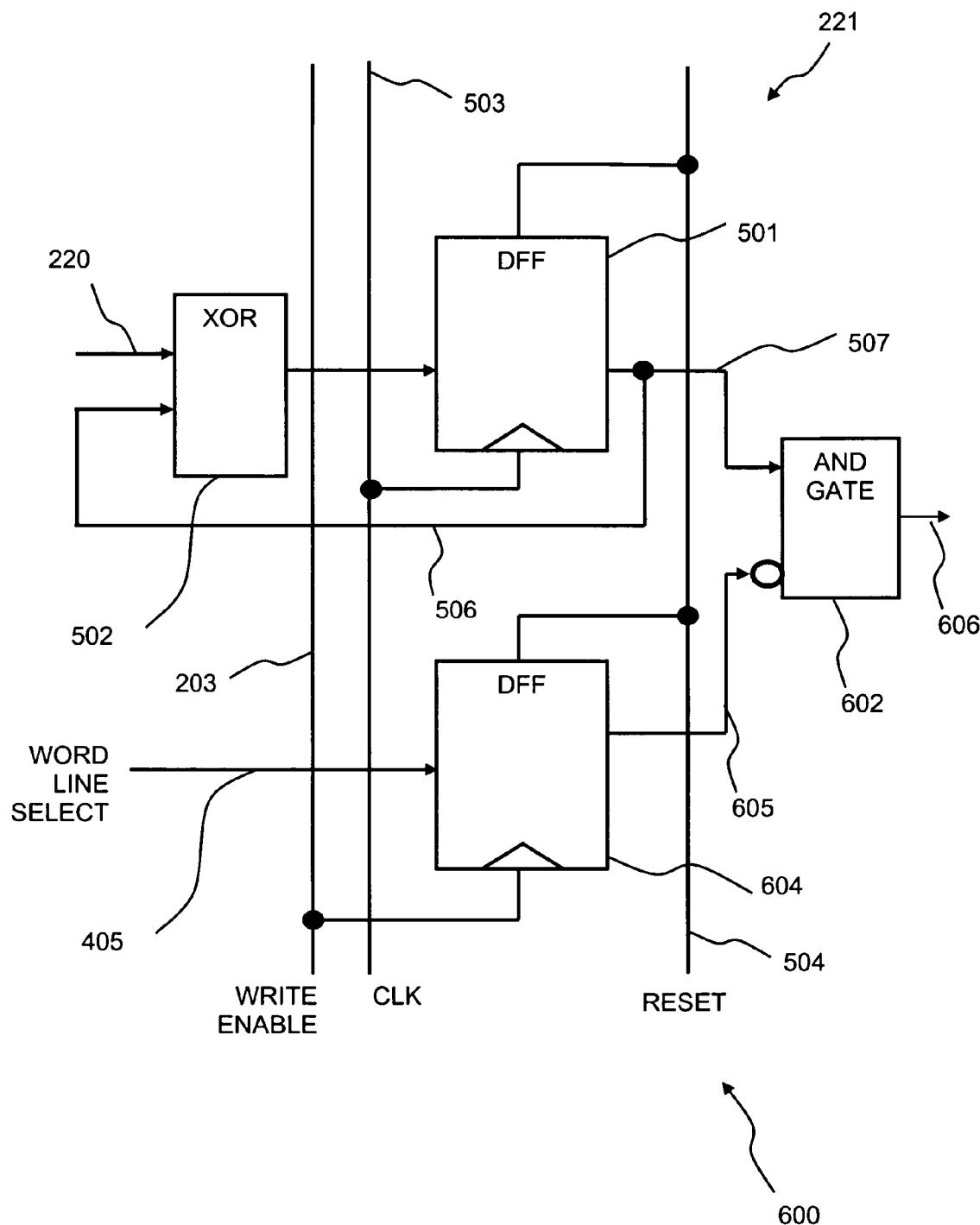
FIG. 6 illustrates an implementation of a rapid parity scan element with a write-gate function in accordance with an embodiment of the present invention.

FIG. 6 illustrates an embodiment of the present invention in which a row parity scanning element 221 is implemented with a "write gate" 600 to prevent confusing a scan result and a simultaneous write command. The write gate in one embodiment is implemented by the addition of cell 604 and an AND gate 602 to the parity scan element discussed in reference to FIG. 5, above.

Here, cell 604 is implemented as a DFF cell and added to the parity scan element 221 by connection of its RESET line to reset line 504. It is noted that in one embodiment, DFF 604 is an identical device to DFF 501. In another embodiment, cell 604 is implemented in different form. The SET connection of DFF 604 is made to the memory chip write enable line 203 (discussed in reference to FIG. 2, above). The data input connection of DFF 604 is connected to the word line select 405 for the word row in consideration.

The output 605 of DFF 604 is connected to an inverting input of AND gate 602. A non-inverting input of two-input AND gate 602 is connected to parity scan result output 507 of DFF 501.

When scanning is initiated at the same time as a write command in this embodiment, the bit parity scan result is at result output 507. If word line select 405 is high, meaning that the associated word line is the word row selected in the write command, a write enable 203 sets DFF 604, and its output 605, to a high state. Because the input to AND gate 602 is inverting, a high signal at 605 results in a low state at the AND gate output 606, no matter what the state of result output 507. When word line select 405 goes low, write enable 203 sets DFF 604 to low state, allowing the output 507 of DFF 501 to be read at the output 606 of AND gate 602. In this manner, a simultaneous write command is not confused with a high state of result output 507 and a false parity error is avoided. A write command can be said to invalidate a parity scan operation.

A novel method for scanning bit parity in a memory array, and a circuit for implementing it, are disclosed. In a memory array that has one or more rows of memory cells, the method for checking data parity includes storing a plurality of data bits in the memory cells, scanning a row of memory cells independently of a memory read operation to ascertain the stored data bits; and determining parity for the row of memory cells by the results of the scanning. The method is accomplished by means of a dedicated parity scanning circuit.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:
1. In a memory array comprising one or more rows of memory cells, a method for checking data parity, comprising:
   storing a plurality of data bits in said memory cells, each of said memory cells comprising a pair of inverters cross coupled to form a latching memory cell and a pair of driving transistors electronically coupled to said latching memory cell and enabling said latching memory cell to function as a static random access memory cell;
   scanning a row of said memory cells, independently of a read operation for said memory cells, by coupling a scanning transistor to read a voltage state at an output of one inverter of said pair of inverters in said latching memory cell to determine said data bits; and
   determining parity for said row of said memory cells by a result of said scanning.

2. The method described in claim 1 wherein said scanning is accomplished by means of a dedicated parity scanning circuit.

3. The method described in claim 1 wherein said scanning and said determining are enabled to be accomplished simultaneously for a plurality of said rows of memory cells.

4. The method described in claim 1 wherein said result of said scanning comprises a sum said scanned data bits.

5. The method described in claim 4 wherein said determining the parity of said row of said memory cells is accomplished by ascertaining said sum.

6. The method described in claim 1 further comprising making the result of said determining parity available to other circuitry.

7. The method described in claim 1 wherein said plurality of data bits includes one or more parity bits.

8. The method described in claim 7 wherein said parity bits are associated with error correcting code.

9. The method described in claim 1 wherein said plurality of data bits comprises a data word.

10. The method described in claim 9 wherein said data word is stored in an array of said rows of memory cells.

11. The method described in claim 10 wherein said array of said rows of memory cells comprises a plurality of logical rows of memory cells.

12. The method described in claim 1 wherein said storing a plurality of data bits comprises a memory write operation.

13. A semiconductor memory cell enabled for rapid parity scan, comprising:
   a static random access memory cell comprising a pair of inverters cross coupled to form a latching memory cell and a pair of driving transistors electronically coupled to said latching memory cell and enabling said latching memory cell to function as a static random access memory cell;
   a scanning transistor electronically coupled to an output of one inverter of said pair of inverters in said latching memory cell for coupling to a voltage state of said output;
   a parity scan enable line electronically coupled to the gate of said scanning transistor for initiating said coupling; and
   a row parity scan line electronically coupled to said scanning transistor for communicating said voltage state to a parity scanning element, wherein said scanning transistor is enabled to couple said voltage state of said output to said row parity scan line independently of a read operation for said static random access memory cell.

14. The semiconductor memory cell described in claim 13, wherein said scanning transistor is operable without effect on the state of said static random access memory cell.

15. The semiconductor memory cell described in claim 13, wherein said scanning transistor is an NMOS transistor.

16. A semiconductor memory device, comprising:
   a plurality of memory cells logically arrayed to form a word line of memory, wherein one or more of said memory cells is a parity bit storage cell, wherein each of said memory cells comprises a pair of inverters cross coupled to form a latching memory cell and a pair of driving transistors electronically coupled to said latching memory cell and enabling said latching memory cell to function as a static random access memory cell;
   a scanning transistor electronically coupled to an output of one inverter of said pair of inverters in said latching memory cell for coupling to a voltage state of said output;
   a row parity scan line electronically coupled to said scanning transistor of each cell of said plurality of memory cells, said row parity scan line enabled to receive said voltage state of said output from said scanning transistor independently of a read operation for said semiconductor memory device;
   a parity scan element coupled to said row parity scan line, said parity scan element enabled to compute and hold a value deriving from a parity scan of said plurality of memory cells;
   a logic gate to ensure distinction between bit scan results in said memory cell; and
   a set of control logic lines enabled to initiate said parity scan and to read the result of said parity scan.

17. The semiconductor memory device described in claim 16, further comprising a write gate.

18. The semiconductor memory device described in claim 17, wherein said write gate comprises a memory cell and a logic gate enabled to prevent a parity scan of a word row during a write operation in said word row.

19. The semiconductor memory device described in claim 18, wherein said logic gate to prevent a parity scan during a write operation is an AND gate.

20. The semiconductor memory device described in claim 16, wherein said memory cell enabled to hold a computed value is a set/reset memory cell.

21. The semiconductor memory device described in claim 16, wherein said logic gate to ensure distinction between bit scan results is an exclusive OR gate.

22. The semiconductor memory device described in claim 16, wherein said computed value deriving from a parity scan of said plurality of memory cells is a summation of the bit values stored in said plurality of memory cells.

* * * * *

UNITED STATES PATENT AND TRADEMARK OFFICE
CERTIFICATE OF CORRECTION

| | | |
|---|---|---|
| PATENT NO. | : 7,565,597 B1 | Page 1 of 1 |
| APPLICATION NO. | : 11/315971 | |
| DATED | : July 21, 2009 | |
| INVENTOR(S) | : Branth et al. | |

It is certified that error appears in the above-identified patent and that said Letters Patent is hereby corrected as shown below:

Column 8, line 9, "RAN" should read --R/W--.

Signed and Sealed this

Twentieth Day of April, 2010

David J. Kappos
*Director of the United States Patent and Trademark Office*